(12) United States Patent
Otaki et al.

(10) Patent No.: US 6,489,574 B1
(45) Date of Patent: Dec. 3, 2002

(54) PRINTED-WIRING BOARD

(75) Inventors: Toru Otaki, Tokyo (JP); Hideho Inagawa, Yokohama (JP); Toru Osaka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/702,763

(22) Filed: Nov. 1, 2000

(30) Foreign Application Priority Data

Nov. 2, 1999 (JP) .............................. 11-312963
Sep. 26, 2000 (JP) ........................ 2000-292146

(51) Int. Cl.⁷ .............................. H05K 1/11; H05K 1/03
(52) U.S. Cl. ..................... 174/262; 174/255; 174/261; 361/777; 361/792; 361/803
(58) Field of Search ................................ 174/262, 255, 174/260, 263, 264, 265, 266, 250, 261, 52.4; 361/792, 760, 767, 772, 777, 780, 794, 793, 803, 805, 807, 719, 774, 783; 428/209

(56) References Cited

U.S. PATENT DOCUMENTS

| | | | | |
|---|---|---|---|---|
| 4,912,603 A | * | 3/1990 | Seyama ...................... 361/409 |
| 5,686,699 A | * | 11/1997 | Chu et al. .................. 174/52.4 |
| 5,741,726 A | * | 4/1998 | Barber ....................... 438/125 |
| 5,777,277 A | * | 7/1998 | Inagawa ..................... 174/265 |
| 5,784,262 A | * | 7/1998 | Sherman ..................... 361/777 |
| 5,847,936 A | * | 12/1998 | Forehand et al. ........... 361/777 |
| 6,064,113 A | * | 5/2000 | Kirkman ..................... 257/691 |
| 6,072,126 A | * | 6/2000 | Shiga et al. ................ 174/250 |
| 6,194,668 B1 | * | 2/2001 | Horiuchi et al. ........... 174/261 |
| 6,218,630 B1 | * | 4/2001 | Takigami .................... 174/261 |
| 6,285,560 B1 | * | 9/2001 | Lyne .......................... 361/760 |

* cited by examiner

Primary Examiner—Albert W. Paladini
Assistant Examiner—I B Patel
(74) Attorney, Agent, or Firm—Fitzpatrick, Cella, Harper & Scinto

(57) ABSTRACT

A printed wiring board having assembled thereon a grid array type package, a multi-terminal device with many terminals arranged in matrix, is provided, through first signal connection holes, signal lines, and second connection holes, with many numbers of lands divided into plural blocks, being arranged in matrix on a first layer to connect each terminal of the multi-terminal device correspondingly, signal line patterns connected with many lands, and drawn out in the same direction per block, and first signal patterns from lands positioned on the innermost line of many lands. Then, the wiring patterns of the signal lines are drawn out regularly from many lands formed in matrix on the assembling surface of the grid array type package to make it easier for the printed wiring board to effectuate wiring connections without making them complicated or increasing the number of layers of the printed wiring board. Also, with the provision of ground patterns that surround signal lines, it is made possible to reduce unwanted radiant, as well as to suppress the occurrence of malfunctions of electronic equipment due to reflections and ground bounces.

11 Claims, 9 Drawing Sheets

PRINTED-WIRING BOARD

BACKGROUND OF THE INVENTION

1. Field of the Invention

The present invention relates to a printed-wiring board. More particularly, the invention relates to a printed-wiring board provided at least with a first layer and a second layer, having multi-terminal devices, such as a grid array package ICs, installed hereon with a plurality of terminals arranged in a plane configuration.

2. Related Background Art

Conventionally, along with the electronic equipment the functions of which are made higher increasingly, the integration of semiconductor devices has been higher still, and the numbers of outer terminals of an LSI package are on the increase accordingly. There are in practical use, among some others, a ball grid array package (BGA) having 500 or more connecting terminals formed therefor, and a chip scale package (CSP) having connecting terminals arranged in the form of array at narrower pitches. For such package of grid array type, soldered bumps or some other terminals are formed in general on the bottom face of a package base plate. Then, electrical connections are implemented by assembling and connecting these terminals with the lands of a printed-wiring board.

Now, however, it is difficult to draw out pattern from the inner lands among many numbers of lands on a printed-wiring board with which are connected many numbers of terminals arranged for a package of grid array type. To counteract this, it has been practiced to provide a plurality of signal layers for the printed-wiring board of multi-layered structure or to effectuate the interruption of signal layers into the power supply-source layer and the ground layer.

In other words, if a package is of quad-flat package (QFP) or of tape carrier package (TPC), only one line of terminals is arranged on the outer side of a package so that signal lines can be drawn out from the terminals of the printed-wiring board easily without any particular arrangement. Therefore, it is good enough for a printed-wiring board to use just one layer as the signal layer. Thus, the other layers can be used for the power supply-source pattern, the ground patterns, and the like. However, for a printed-wiring board having a grid array type package assembled thereon, plural signal layers are needed in order to draw out signal lines from the inner lands. The resultant number of layers becomes many for the printed-wiring board in use or the signal lines should be interrupted into the power supply-source layer and ground layer in order to suppress the layer numbers of the printed-wiring board.

Here, on the other hand, there is a constant demand in making the clock frequency of digital circuit of electronic equipment higher still.

Now, hereunder, the existing problems will be described, at first, as to a package of grid array type assembled on a printed-wiring board.

FIG. 15 is a plan view which shows the first layer, the surface, of the conventional double-layer printed wiring board generally in use, on which a ball grid array package is assembled. FIG. 16 is a plan view which shows the second layer, the reverse side, of the printed wiring board represented in FIG. 15, and arranged to be a perspective view in order to make the positional relations clear between them. Then, in order to distinguish the positional relations with lands in FIG. 15, the land positions are indicated by dotted lines in FIG. 16.

In FIG. 15, signal lines 52 and 62, and the power supply-source pattern 54 and ground pattern 56 are connected with the land 51. Of many lands, it is not easy to draw out patterns from the inner ones. Thus, the inner lands are connected with signal pattern on the second layer shown in FIG. 16 by way of through holes 53, 55, and 57.

In FIG. 16, a part of signal pattern shown in FIG. 16 is connected with the signal pattern on the second layer by way of through holes. For example, the signal line 62 is connected with the signal line 58 on the second layer by way of a through hole 53. Likewise, the power supply-source pattern 54 is connected with the power supply-source pattern 59 on the second layer by way of a through hole 55. The ground pattern 56 is connected with the ground pattern 60 on the second layer by way of a through hole 57. Here, a reference numeral 61 designates the by-pass capacitor land which is assembled between the power supply-source pattern 63 and the ground pattern 64.

As clear from FIG. 16, the grid array package assembled on a double-layer printed wiring board makes it impossible to arrange the ground pattern freely due to the existence of signal lines and others. The ground pattern should be made far from being in an ideal plane configuration. The structure of the ground pattern tends to become such a portion that may present many chipping.

To avoid this condition, a multi-layer printed wiring board is used, in which signal layers are increased so that a layer is dedicated for use of the power supply-source, and another for grounding. In this case, however, costs become significantly high, and also, there is a problem encountered that printed wiring board becomes heavier.

Now, the description will be made of the problems existing in using a printed wiring board having digital circuits installed thereon for the use of a high speed clocking frequency.

Generally, when considering a differential mode irradiation, the field strength in the direction of maximum irradiation can be expressed by the following formula ("A Practical Technique for Gradually Decreasing Noises" p.324, Published by Jatech Shuppan):

$$E = 263 \times 10^{-16} \, (f^2 \cdot A \cdot I) \, (1/r)$$

where E is field strength (V/m); f, frequency (Hz); A, loop area (m$^2$), I, current (A), and r, distance (m) to receiving antenna.

As understandable from the above formula, it is desirable to make the loop area A as small as possible for the high frequency current I which may create the problem of irradiated noises. In other words, in order to prevent noises from being irradiated, the digital signal lines should be made as short as possible, and also, the ground pattern or the power supply-source pattern where return current runs should desirably be arranged as near the signal lines as possible. Also, among digital circuits, special care should be given to the clock signal lines through which high frequency signals flow. Likewise, it is desirable to make the loop area A as small as possible for a high frequency current which runs between the power supply-source and the ground.

Also, the ground pattern that has many chipped portions may result in the increase of reflection that tends to invite the disturbance of signal waveforms or may invite ground bounces. Then, it becomes easier for equipment to malfunction.

Now, with reference to FIG. 17, this condition will be described further in detail.

FIG. 17 is a cross-sectional view of a printed wiring board which schematically shows the relationship between the pattern arrangement of signal lines, power supply-source lines, ground lines, and others on the printed wiring board, and the loop areas.

In FIG. 17, a reference numeral 101 designates an IC output buffer; 102, an IC that receives signals; 103, a signal line; 105, a power supply-source line; 106, a ground line; and 104, a bypass capacitor.

The loop area A expressed in the above formula corresponds to the loop A surrounded by the signal line 103 and the ground line 106 in FIG. 17, the loops B and C surrounded by the power supply-source line 105 and ground line 106 up to the position where the bypass capacitor 104 is assembled, and the loops D and E which are created when the bypass capacitor does not work effectively.

FIG. 18 is a cross-sectional view of the printed wiring board which corresponds to FIG. 17, and shows the changes of the loop areas due to the chipping of the ground pattern.

In FIG. 16, there are chipping portions for the ground patterns 60 and 64 in the vicinity of the package assembling lands. With the signal output pins being considered as reference, for example, this is the condition where any ground pattern is arranged near the signal line. Then, as the loop G shown in FIG. 18, the increase of loop area is invited, thus increasing unwanted radiant noises (irradiated noises). In this respect, thick lines in FIG. 16 indicate either the thick pattern on the printed wiring board or the smaller inductance due to smaller chipping portions.

Also, if the ground pattern is away from the signal line, the characteristic impedance becomes larger, and it tends to create inconformity with the portion to which the ground pattern is formed closer, hence making a larger reflection.

Moreover, if the chipping portion of the ground pattern is greater in the vicinity of IC, the inductance becomes larger to generate greater ground bounces.

SUMMARY OF THE INVENTION

The present invention is designed in consideration of the problems discussed above. It is an object of the invention to provide an inexpensive and light printed wiring board having grid array type package assembled thereon with a lesser amount of unwanted radiant noises, being capable of suppressing the malfunction of electronic equipment that may be caused by reflections or ground bounces.

It is another object of the invention to provide a printed wiring board capable of making connections easier, for which the wiring pattern of signal lines can be drawn regularly from many numbers of lands formed in matrix on the assembling surface of grid array type package so that wiring is not made complicated without increasing the layers of the printed wiring board.

Other objectives and advantages besides those described above will be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

Hereinafter, with reference to the accompanying drawings, the description will be made of the embodiments in accordance with the present invention.

First Embodiment

Figure 1:
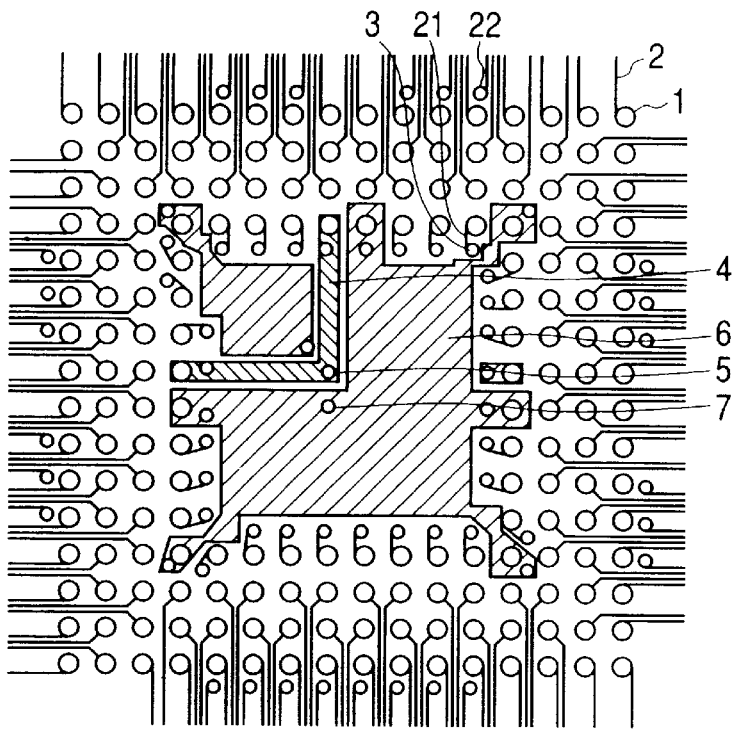
FIG. 1 is a plane view which shows one layer of a double-layer printed wiring board in accordance with a first embodiment of the present invention.
Figure 2:
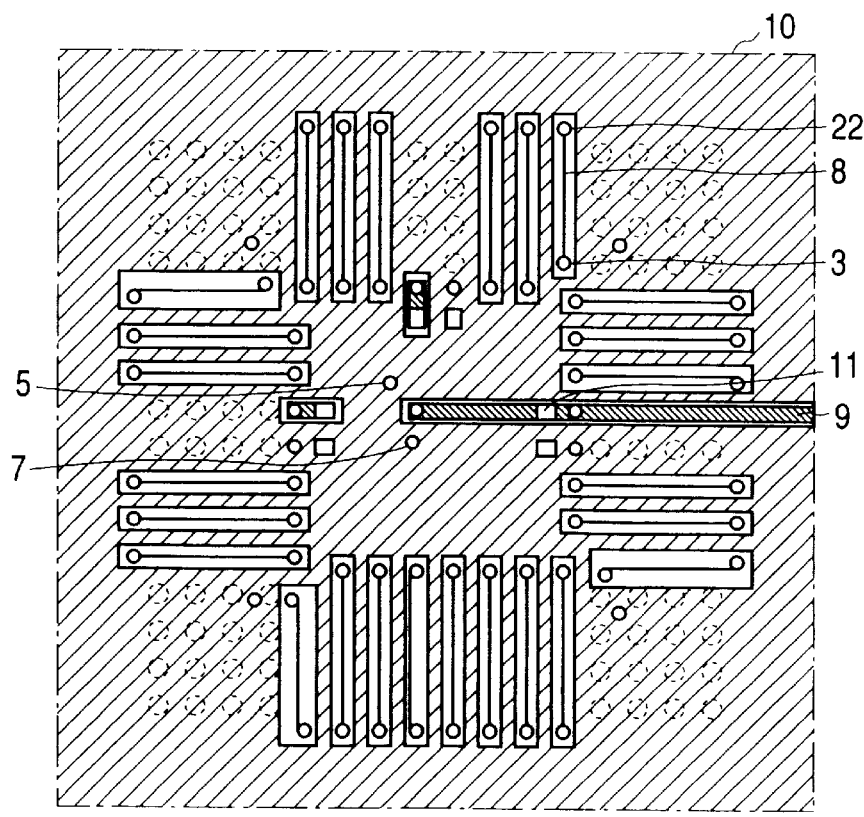
FIG. 2 is a plan view which shows the double-layer printed wiring board represented in FIG. 1.

FIG. 1 is a plane view which shows the first layer, the surface of a double-layer printed wiring board in accordance with a first embodiment of the present invention. FIG. 2 is a plan view which shows the second layer, the reverse side, of the double-layer printed wiring board. FIG. 2 is a perspective view to distinguish the positional relation with each other, indicating the land position in FIG. 1 by dotted lines so that the positional relations with the lands is made clear.

In FIG. 1, a signal pattern 2, a power supply-source pattern 4, and a ground pattern 6 are connected with a land 1 where a ball grid array package is assembled.

Also, for the first layer, through holes 3, 5, and 7 are arranged for connection with the second layer shown in FIG. 2. For example, each of the through holes 3, 5, and 7 is formed for the signal line 21, the power supply-source pattern 4, and the ground pattern 6, respectively.

In FIG. 2, the first layer shown in FIG. 1 is connected with the second layer by way of the through holes. For example, the signal line 21 is connected with the signal line 8 on the second layer by way of the through hole 3. Likewise, the power supply-source pattern 4 is connected with the power supply-source pattern 9 by way of the through hole 5, and the ground pattern 6 is connected with the ground pattern 10 by way of the through hole 7. Here, a reference numeral 11 designates the land of a bypass capacitor which is assembled between the power supply-source pattern 9 and the ground pattern 10.

In FIG. 2, the signal line 8 extends from the through hole 3 to the through hole 22, and the through hole 22 is structured to be connected with the signal pattern on the first layer. The through hole 22 on the first layer is arranged slightly outside of the outermost land where the grid array package is assembled.

Therefore, it becomes possible to form the ground pattern 10 to surround the signal line 8 and through holes 3 and 22 on the second layer, hence enabling the ground pattern 10 to be a portion having a smaller amount of chipping that may present substantially an ideal plane pattern.

As shown in FIG. 2, all the signal lines, which are connected with the innermost lands where the grid array package is assembled, are structured in the same manner as the signal line 8. Here, however, the present invention is not limited to this structure. For example, it may be possible to collect plural numbers of signal lines together, and surround the circumference thereof by the ground pattern.

Figure 3:
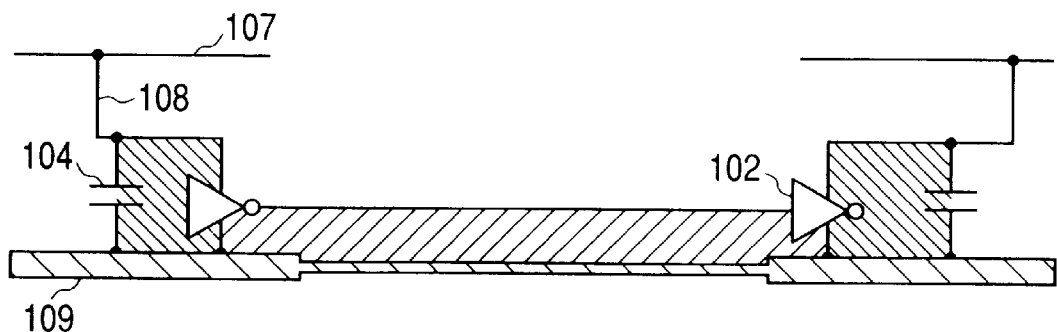
FIG. 3 is a cross-sectional view of a printed wiring board, which shows schematically the relations between the pattern arrangement of signal line, power supply-source line, ground line, and others, and the loop areas on the printed wiring board represented in FIG. 1 and FIG. 2.

FIG. 3 is a cross-sectional view of a printed wiring board, which shows schematically the relations between the pattern arrangement of signal line, power supply-source line, ground line, and others, and the loop areas on the printed wiring board represented in FIG. 1 and FIG. 2.

As shown in FIG. 2, the ground pattern 10 is arranged in the vicinity of each of the signal pins, and the structure is made with a smaller amount of chipping. There is no possibility, therefore, to invite the increase of the loop area as in the loop G shown in FIG. 18. Also, with the smaller amount of chipping on the ground pattern 109 near IC, inductance becomes smaller, and also, the influence of ground bounces becomes smaller.

Further, the power supply-source pattern 108 (power supply-source pattern 9 in FIG. 2), which is branched from the nucleus power supply-pattern 107, has an appropriate value of inductance. However, high frequency current is effectively decoupled by the bypass capacitor 104 (the capacity connected with the land 11 for use of the bypass capacitor shown in FIG. 2). Therefore, it becomes possible to reduce unwanted radiant noises.

The aforesaid effects can be obtained by use of the double-layer printed wiring board thus arranged. It is possible, therefore, to manufacture the printed wiring board of the first embodiment in a light weight at lower costs.

Second Embodiment

Figure 4:
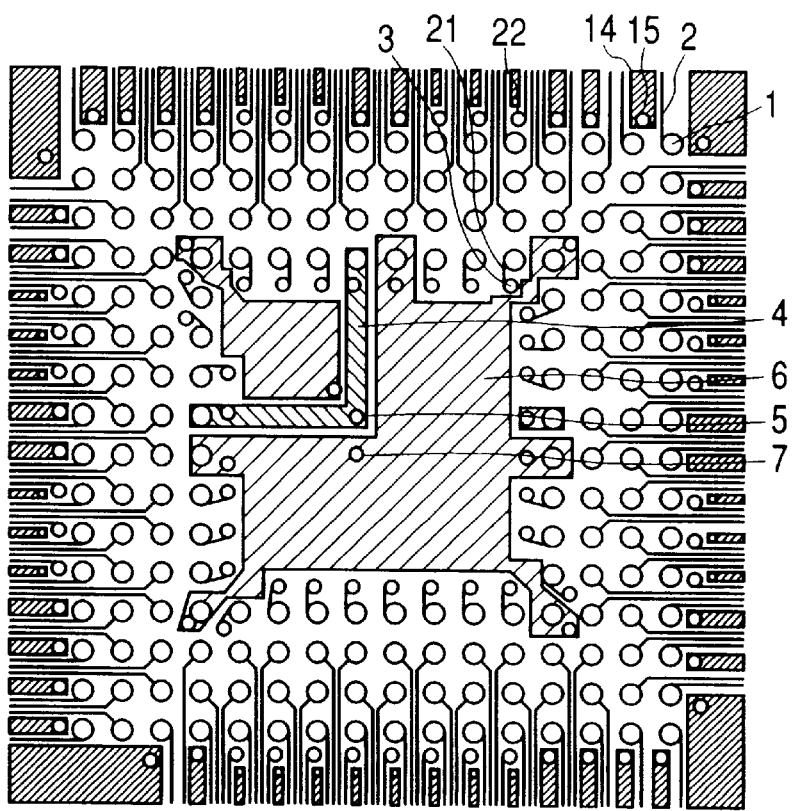
FIG. 4 is a plane view which shows one layer of a double-layer printed wiring board in accordance with a second embodiment of the present invention.
Figure 5:
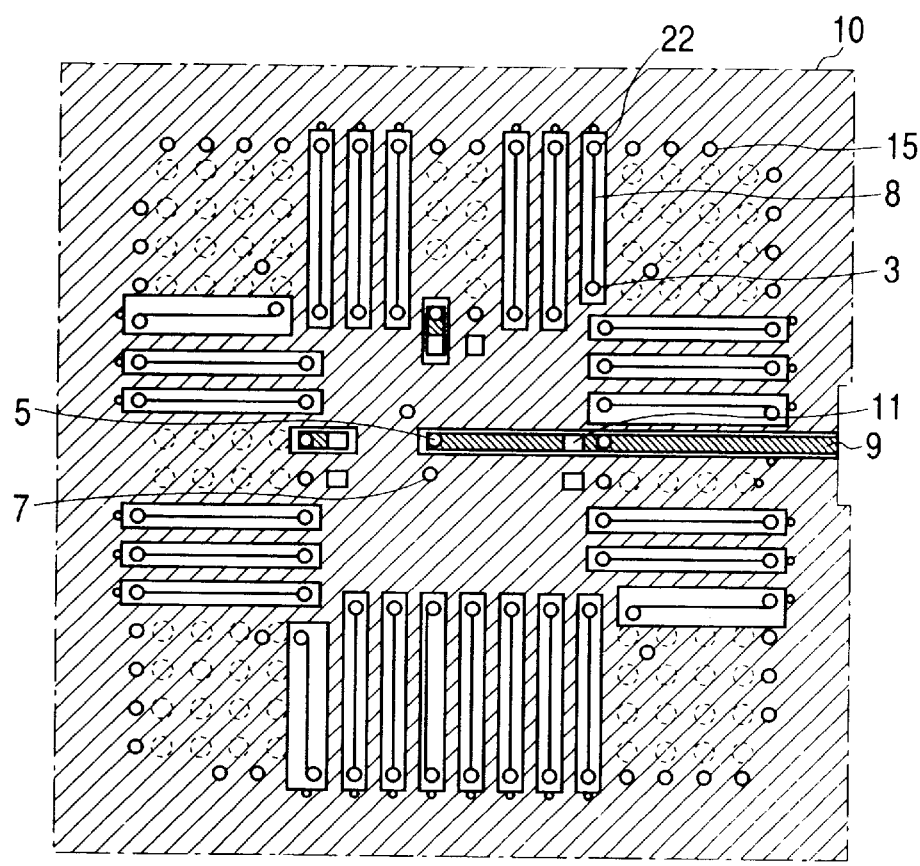
FIG. 5 is a plan view which shows the double-layer printed wiring board represented in FIG. 4.

FIG. 4 is a plane view which shows the first layer, the surface of a double-layer printed wiring board in accordance with a second embodiment of the present invention. FIG. 5 is a plan view which shows the second layer, the reverse side, of the double-layer printed wiring board. The structure of the second embodiment is fundamentally the same as that of the first embodiment. Therefore, the same reference marks are applied to the same parts, and the detailed description thereof will be omitted.

In accordance with the second embodiment, many numbers of ground patters 14 are arranged to bury empty spaces in parallel with the signal lines on the outer side of the outermost lands where the grid array package is assembled on the first layer, which is the surface of the printed wiring board shown in FIG. 4. As shown in FIG. 5, these ground patterns are electrically connected with the ground pattern 10 on the second layer, which is the reverse side of the printed wiring board, by way of the through holes 15.

Figure 6:
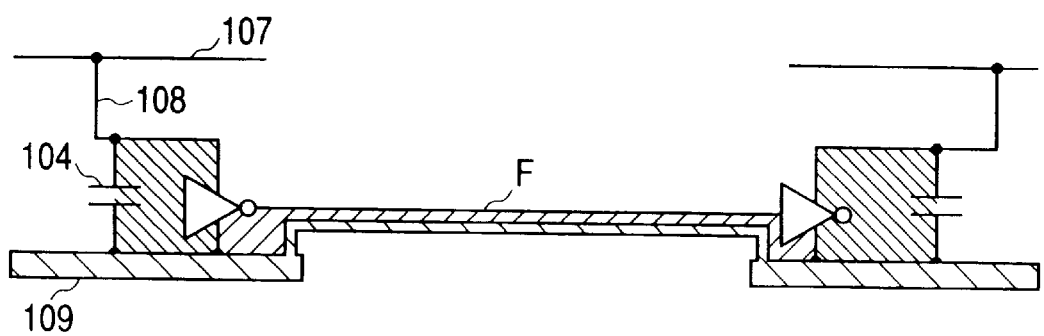
FIG. 6 is a cross-sectional view of a printed wiring board, which shows schematically the relations between the pattern arrangement of signal line, power supply-source line, ground line, and others, and the loop areas on the printed wiring board represented in FIG. 4 and FIG. 5.

FIG. 6 is a cross-sectional view of a printed wiring board in accordance with the second embodiment, which shows schematically the relations between the pattern arrangement of signal line, power supply-source line, ground line, and others, and the loop areas on the printed wiring board.

Figure 18:
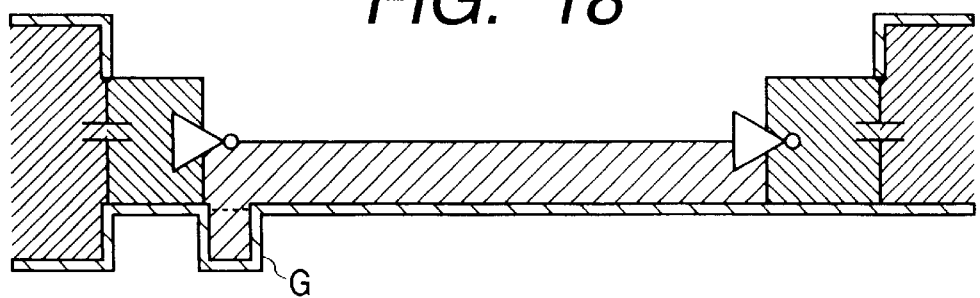
FIG. 18 is a cross-sectional view of a printed wiring board corresponding to the one shown in FIG. 17, which illustrates the changes of loop area due to the chipping of ground pattern.

As in the first embodiment, the ground pattern 10 is arranged in the vicinity of each of the signal pins to form a structure where the chipping portions are made smaller. Therefore, there is no possibility to invite increasing the loop area G as shown in FIG. 18. Also, the chipping portion of the ground pattern 109 near IC is small. As a result, inductance becomes smaller, and the influence of ground bounces also becomes smaller. Also, the power supply-source pattern 108, which is branched from the nucleus power supply-source pattern 107, has an appropriate value of inductance. Therefore, high frequency current is decoupled effectively by means of the bypass capacitor 104, hence reducing unwanted radiant noises.

In accordance with the second embodiment, it is further structured to connect the ground pattern 14 arranged near the signal pattern on the first layer, which is the surface of the printed wiring board, with the ground pattern 10 on the second layer, which is the reverse side of the printed wiring board, by way of the through hole 15. As a result, the loop area F becomes smaller to reduce unwanted radiant noises accordingly.

Third Embodiment

Figure 7:
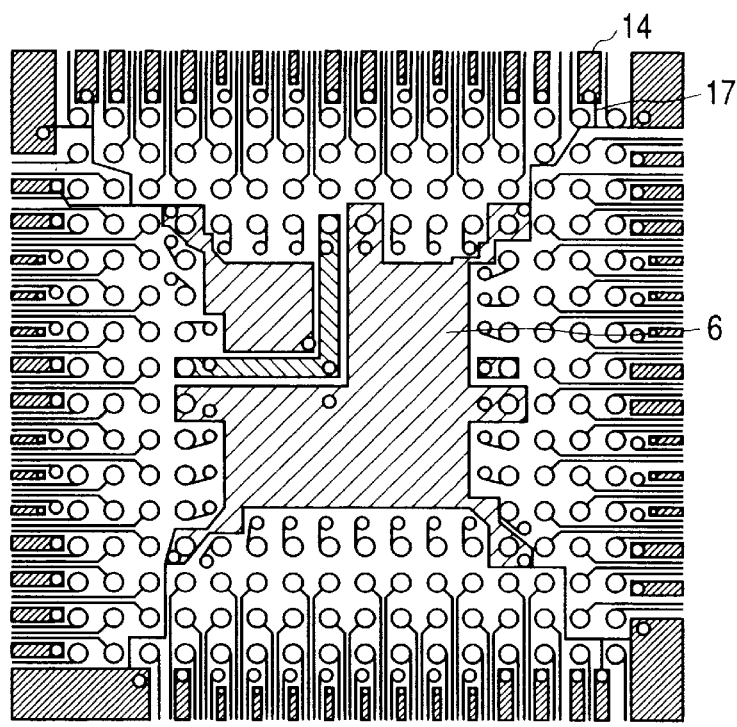
FIG. 7 is a plane view which shows one layer of a double-layer printed wiring board in accordance with a third embodiment of the present invention.
Figure 8:
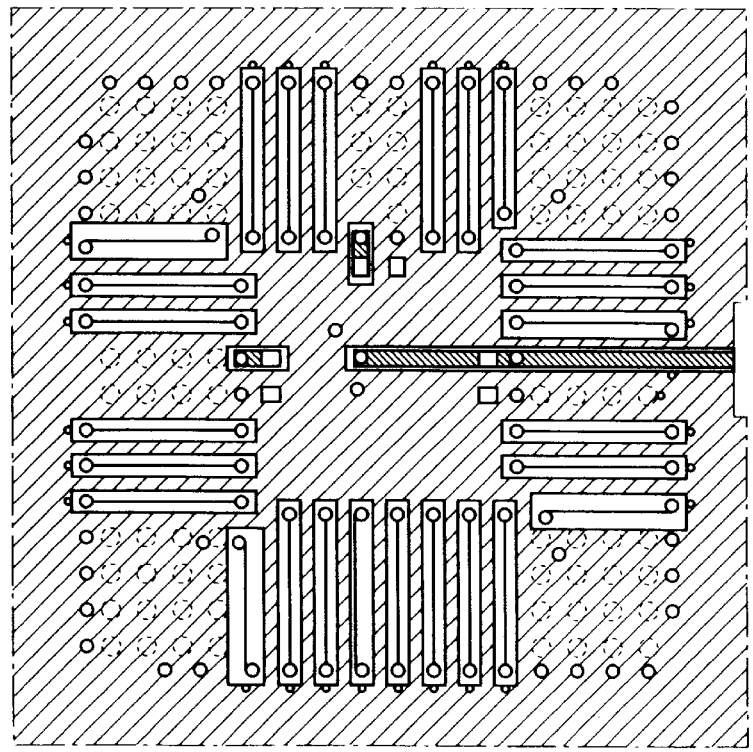
FIG. 8 is a plan view which shows the double-layer printed wiring board represented in FIG. 7.

FIG. 7 is a plane view which shows the first layer, the surface of a double-layer printed wiring board in accordance with a third embodiment. FIG. 8 is a plan view which shows the second layer, the reverse side, of the double-layer printed wiring board. The structure of the third embodiment is fundamentally the same as that of the second embodiment. Therefore, the same reference marks are applied to the same parts, and the detailed description thereof will be omitted.

In accordance with the third embodiment, a ground pattern 17 is arranged anew on the first layer, the surface, of the printed wiring board shown in FIG. 7. With the ground pattern 17, a part of the ground pattern 14 which is arranged in parallel with signal line is connected with the ground pattern 6 which is arranged inner side of the innermost line of lands for use of grid array package connection.

With the structure thus arranged, the function of the ground is made stronger.

Figure 9:
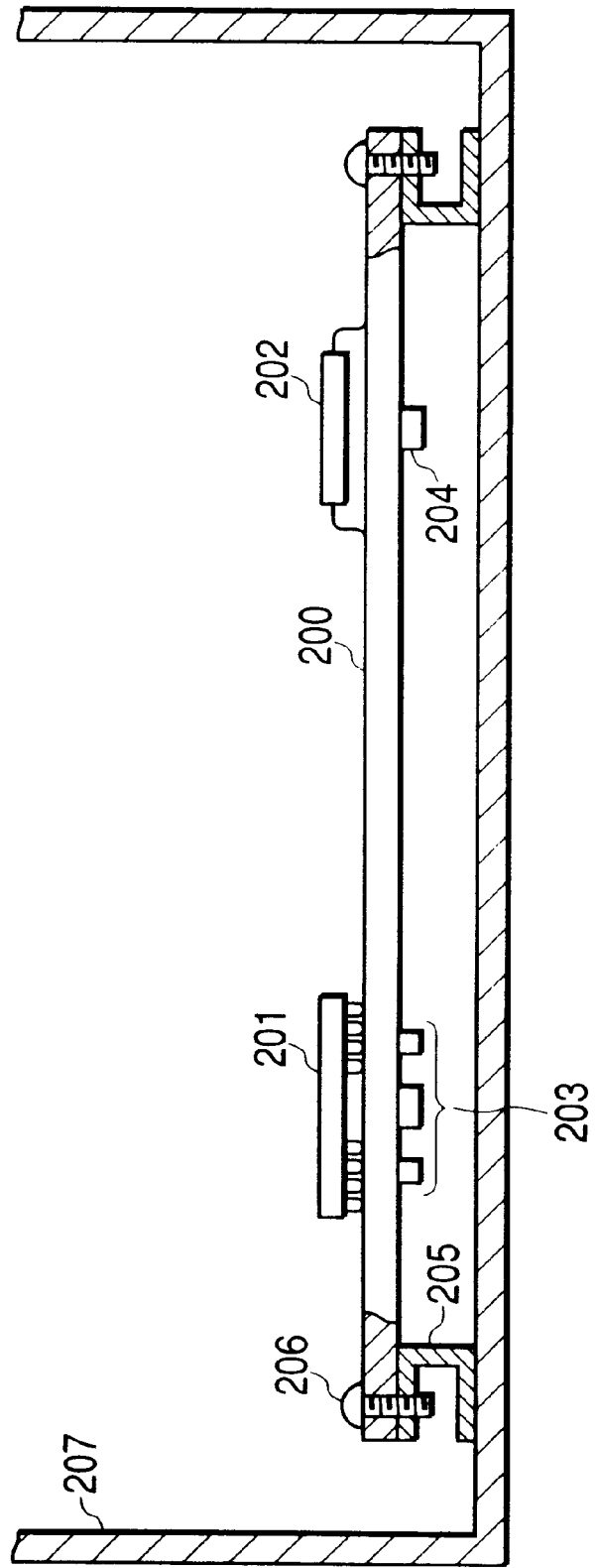
FIG. 9 is a cross-sectional view which shows an electronic equipment provided with the printed wiring board represented in FIG. 1.

Here, FIG. 9 is a cross-sectional view which shows an electronic equipment provided with a printed wiring board illustrated in each of the embodiments described above.

In FIG. 9, a reference numeral 200 designates a double layer printed wiring board, and the double-layer printed wiring board 200 is of the same structure as the double-layer printed wiring board shown in each of the embodiments described above. The ball grid array package type IC 201 is assembled on it. Further, for the double-layer printed wiring board 200, an IC 202 is assembled, which corresponds to the IC 102 shown in FIG. 3. On the bottom face of the double-layer printed wiring board 200, a chip capacitor 203 and a chip capacitor 204 are assembled. The chip capacitor 203 is the bypass capacitor for use of the IC 201 solder connected with the bypass capacitor for the land 11 shown in FIG. 2. The chip capacitor 204 is the bypass capacitor for use of the IC 202. In this respect, for the double-layer printed wiring board 200, there are many other components assembled besides those described above. In FIG. 9, however, the representations thereof are omitted.

A reference numeral 207 designates the metal housing of the electronic equipment. The metal housing 207 is a part of the frame that forms the electronic equipment. For this housing, supporting members 205 are fixed to install the printing wiring board. The double-layer printed wiring board 200 is fixed to the supporting member 205 by means of screws 206.

For an electronic equipment, each nation has a regulation so as not to allow unwanted radiant noises to be generated more than a specific level. The electronic equipment shown in FIG. 9 is able to implement lower noise generation even if there is a slight defect as to the shielding of electromagnetic waves.

In other words, unwanted radiant noises from the electronic equipment are irradiated directly from the printed wiring board or the noises which are generated by the printed wiring board are transferred to cables, and irradiated from the cables. To make such arrangement, noise source is surrounded by a metallic housing, for example, so that unwanted radiant noises are not allowed to leak externally, or some other measures are taken for the purpose. Nevertheless, an opening is provided for the metallic housing for various reasons, such as to counteract temperature rise, and unwanted radiant noises are allowed to leak from such opening. The actuality is that more consideration should be given to coping with noise generation.

Here, with the double-layer printed wiring board 200 of the present invention being assembled on an electronic equipment, not only becomes smaller the unwanted radiant noises generated directly from the double-layer printed wiring board 200, but also, the power supply-source and ground of the double-layer printed wiring board 200 are stabilized. Then, the noises which are transferred to cables also become smaller to make noises irradiated from the cables smaller accordingly. As a result, it is possible to implement suppressing the unwanted radiant noises that may be generated from the electronic equipment to an extremely small amount.

Here, for the electronic equipment shown in FIG. 9, the double-layer printed wiring board is used, but the number of layers is not necessarily limited to that one. The material of the housing 207 is metal, but the material is not necessarily limited to metal, either. It may be possible to use plastic or a complex material. The installation method of the double-layer printed wiring board 200 is not necessarily limited to use of screws or the like, either.

Now, the description will be made of the drawing out of the signal line patterns from the double-layer printed wiring board where the grid array type package is assembled as shown in each of the drawings related to each of the embodiments described above.

In other words, when a gird array type package is assembled on a double-layer printed wiring board, the entire wiring patterns of the printed wiring board generally becomes extremely complicated if it is intended to draw out the signal line patterns from many lands formed in matrix on the assembling surface of the grid array type package.

Therefore, in accordance with the present invention, it is intended to simplify the entire wiring patterns on the printed wiring board as much as possible by drawing out the signal line patterns regularly from many lands formed in matrix on the assembling surface of the gird array type package.

In order to achieve this, careful attention is given to regularity with which to draw out the signal line patterns from many lands formed in matrix when designing the present invention. Then, for the implementation of such regular drawing out, many lands in matrix are divided into each block, and the signal line patterns having many lands thus divided into blocks are drawn out in the same direction per block.

Now, at first, with reference to FIG. 10, the description will be made of the block arrangement of many lands 1 which are formed in matrix on the assembling surface of the gird array type package.

Figure 10:
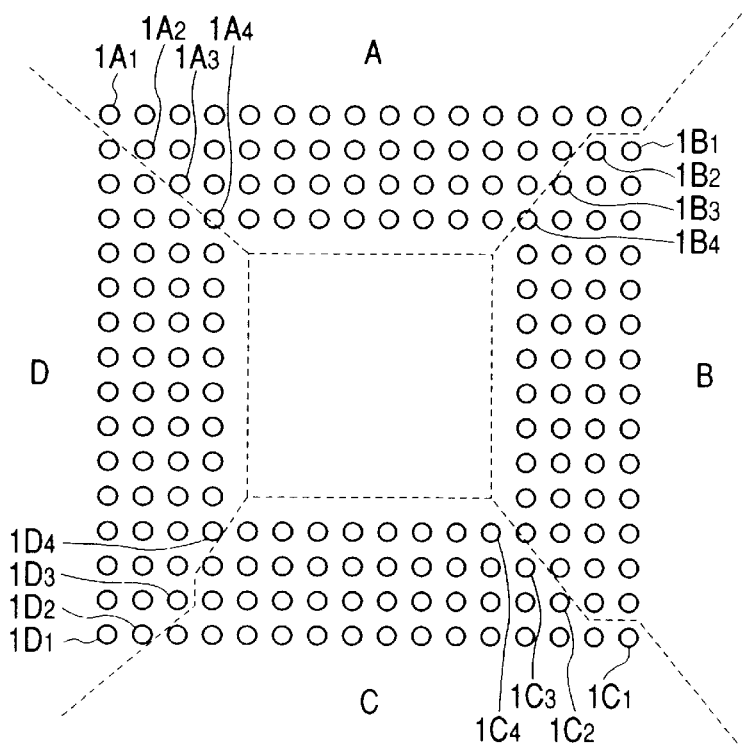
FIG. 10 is a view which shows in a block many numbers of lands on the printed wiring board represented in FIG. 1 where the ball grid array package is assembled.

In FIG. 10, many lands 1 formed in matrix are arranged in four lines from the outermost line to the innermost line, and are divided radially into four blocks, A, B, C, and D. Each of the blocks A, B, C, and D is formed by lands 1A1, 1B1, 1C1, and 1D1 on the outermost line, by lands 1A2, 1B2, 1C2, and 1D2 on the second line from the outermost line, by lands 1A3, 1B3, 1C3, and 1D3 on the third line from the outermost line, and by lands 1A4, 1B4, 1C4, and 1D4 from the outermost line, that is, on the innermost line.

Then, with reference to FIG. 11 to FIG. 13, the description will be made of the drawing out of the signal line patterns 2 from many lands divided into blocks in the same direction per block.

Figure 11:
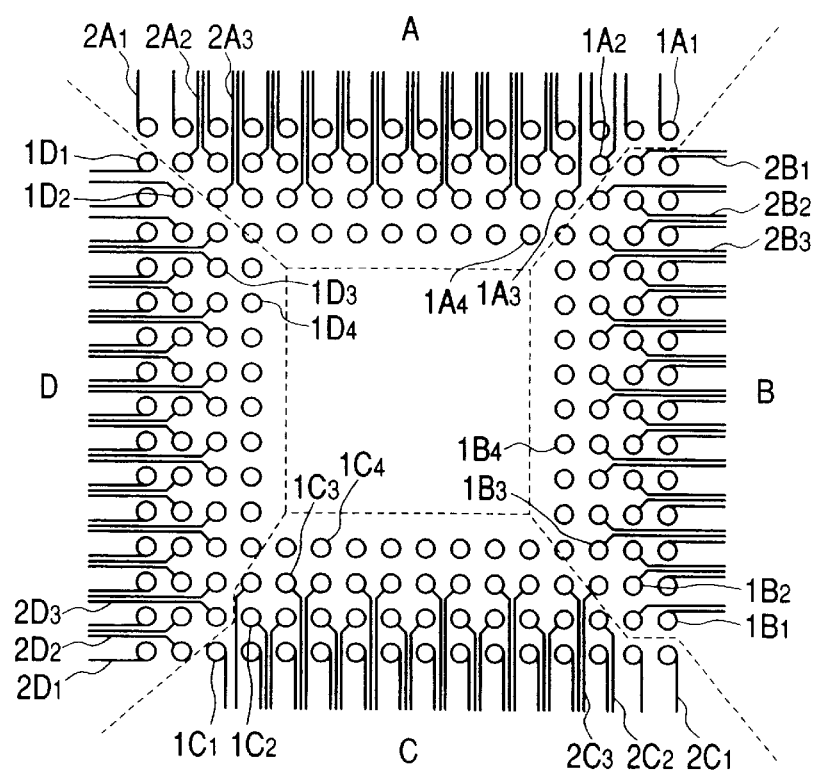
FIG. 11 is a view which illustrates the drawing out of signal line pattern from the outermost line, second line, and third line among many lands in a block on the printed wiring board shown in FIG. 1.

In FIG. 11, the lands 1A1, 1B1, 1C1, and 1D1 on the outermost line of many lands 1 in matrix formed in four lines are provided with the signal line patterns 2A1, 2B1, 2C1, and 2D1 are provided in the external direction without any changes. The second lands 1A2, 1B2, 1C2, and 1D2 from the outermost line of many lands in matrix are likewise provided with the signal line patterns 2A2, 2B2, 2C2, and 2D2 in the external direction. However, the adjacent two are made a pair, and provided with the signal line patterns 2A2, 2B2, 2C2, and 2D2 in the external direction from between the lands 1A1, 1B1, 1C1, and 1D1 on the outermost line. Also, the third lands 1A3, 1B3, 1C3, and 1D3 from the outermost line of many lands in matrix are likewise provided with the signal line patterns 2A3, 2B3, 2C3, and 2D3 in the external direction. However, the adjacent two are made a pair, and provided with the signal line patters 2A3, 2B3, 2C3, and 2D3 in the external direction from between the lands 1A1, 1B1, 1C1, and 1D1 on the outermost line.

The third signal line patterns 2A3, 2B3, 2C3, and 2D3 are provided between the lands 1A1, 1B1, 1C1, and 1D1 on the outermost line and them where the second signal line patterns 2A2, 2B2, 2C2, and 2D2 do not exist. Then, between the lands 1A1, 1B1, 1C1, and 1D1 on the outermost line and them, the third signal line patterns 2A3, 2B3, 2C3, and 2D3, and the second line patterns 2A2, 2B2, 2C2, and 2D2 are arranged alternately.

Since the signal line patterns 2A3, 2B3, 2C3, and 2D3 from the third line, and the signal line patterns 2A2, 2B2, 2C2, and 2D2 from the second line are arranged between the lands 1A1, 1B1, 1C1, and 1D1 on the outermost line, it is difficult to arrange the signal line patterns 2A4, 2B4, 2C4, and 2D4 from the lands 1A4, 1B4, 1C4, and 1D4 on the innermost line of many lands 1 in matrix between the lands 1A1, 1B1, 1C1, and 1D1 on the outermost line.

Figure 12:
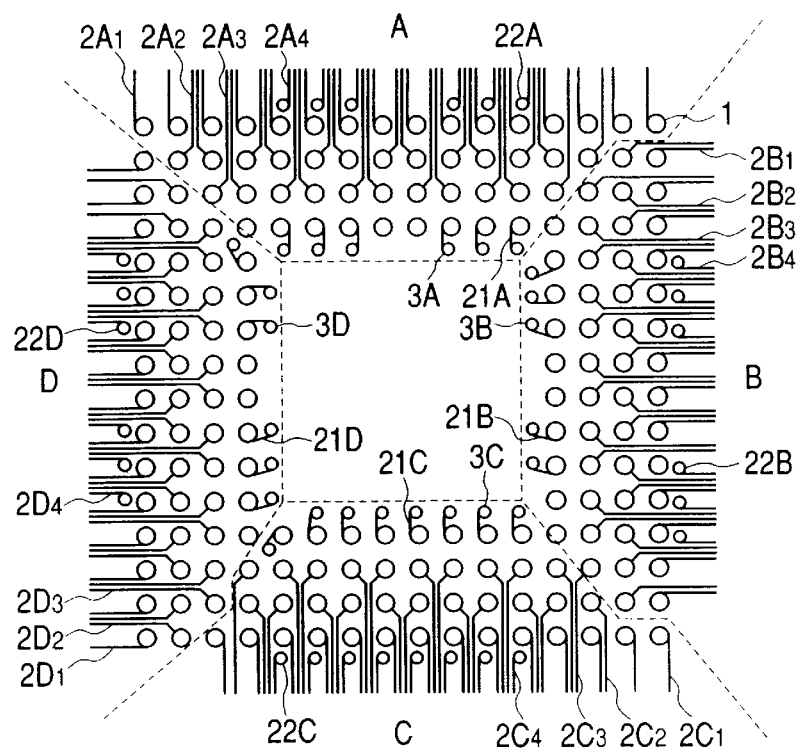
FIG. 12 is a view which illustrates the drawing out of signal line pattern from the innermost line among many lands in a block of the printed wiring board shown in FIG. 1.
Figure 13:
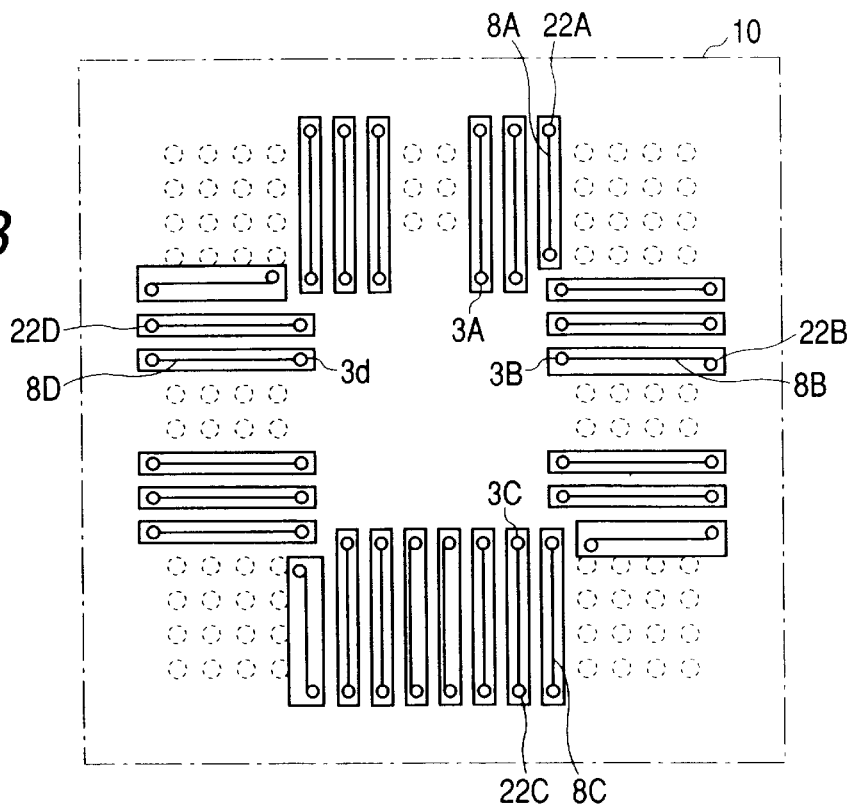
FIG. 13 is a view which illustrates the state of the reverse side of the printed wiring board shown in FIG. 12.

Therefore, as shown in FIG. 12, in the vicinity, the inner side, for example, of the lands 1A4, 1B4, 1C4, and 1D4 on the innermost line, the first through holes 3A, 3B, 3C, and 3D are arranged. Then, on the outer side of the lands 1A1, 1B1, 1C1, and 1D1 on the outermost line, the second through holes 22A, 22B, 22C, and 22D are arranged. The first through holes 3A, 3B, 3C, and 3D, and the second through holes 22A, 22B, 22C, and 22D penetrate between the first and second layers. Then, as shown in FIG. 13, signal lines 8A, 8B, 8C, and 8D are provided between the first through holes 3A, 3B, 3C, and 3D, and the second through holes 22A, 22B, 22C, and 22D. One ends of signal lines 8A, 8B, 8C, and 8D are connected with the first through holes 3A, 3B, 3C, and 3D, and the other ends thereof are connected with the second through holes 22A, 22B, 22C, and 22D, respectively.

In this way, the signal line patterns 2A3, 2B3, 2C3, and 2D3 from the lands 1A4, 1B4, 1C4, and 1D4 on the innermost line of many lands 1 in matrix are installed through the first through holes 3A, 3B, 3C, and 3D, and the signal lines 8A, 8B, 8C, and 8D, and the second through holes 22A, 22B, 22C, and 22D. Thus, the signal lines patterns from the many lands, which are divided into blocks, are directed equally per block. In this respect, the first through holes 3A, 3B, 3C, and 3D are connected with the lands 1A4, 1B4, 1C4, and 1D4 on the innermost line by use of the signal lines 21A, 21B, 21C, and 21D.

Figure 14:
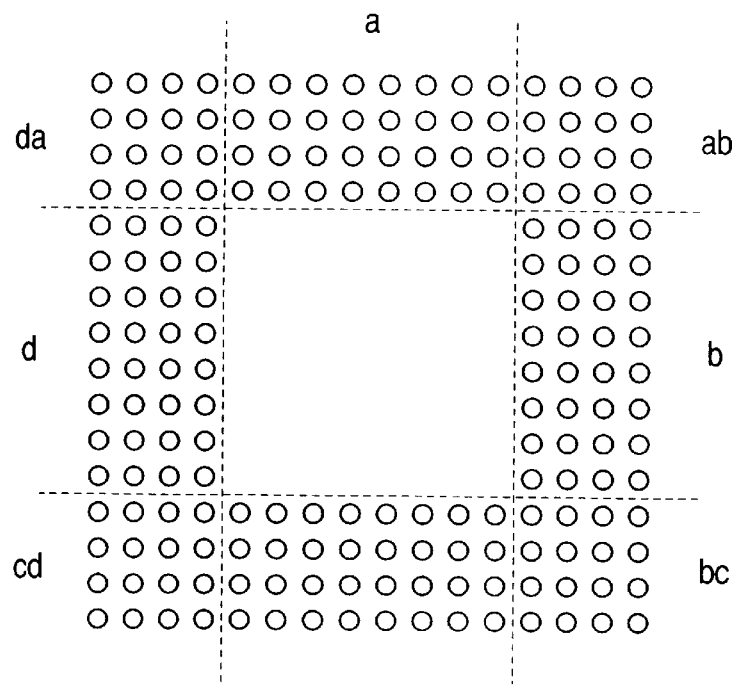
FIG. 14 is a view which illustrates the method whereby to arrange many lands in a block on the printed wiring board shown in FIG. 1.
Figure 15:
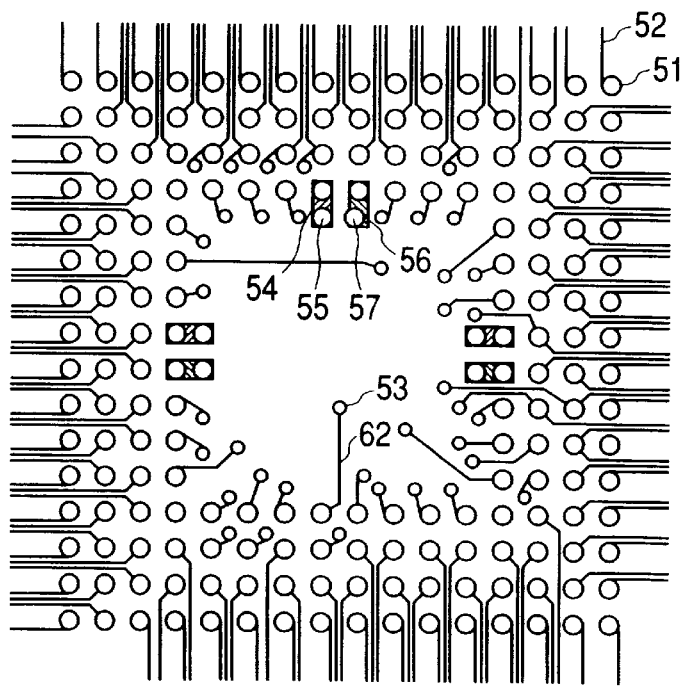
FIG. 15 is a plan view which shows the conventional double-layer printed wiring board generally in use, on which the ball grid array package is assembled.
Figure 16:
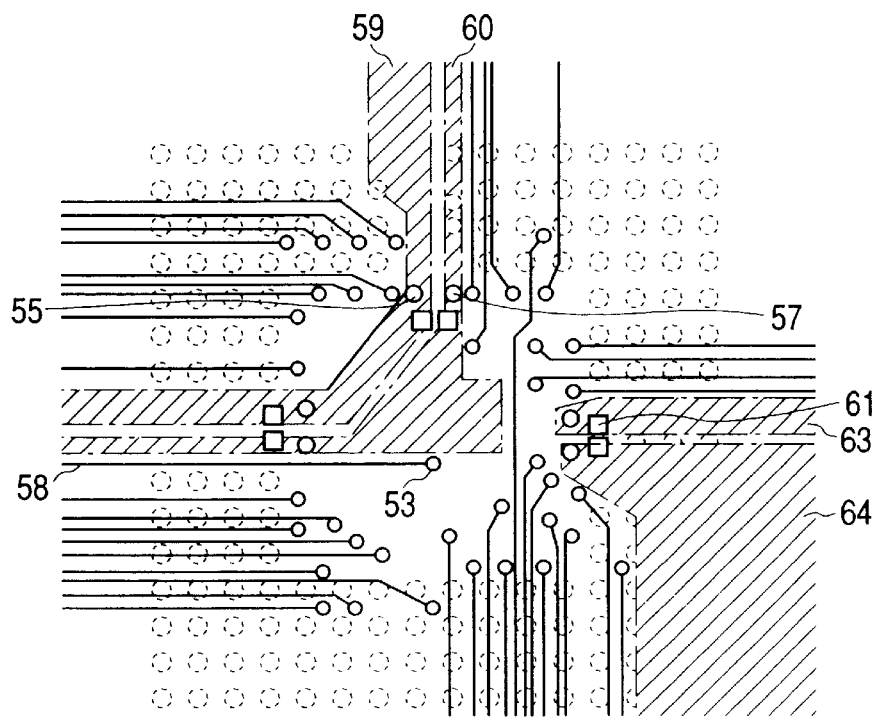
FIG. 16 is a plan view which shows the second layer of the conventional printed wiring board represented in FIG. 15.
Figure 17:
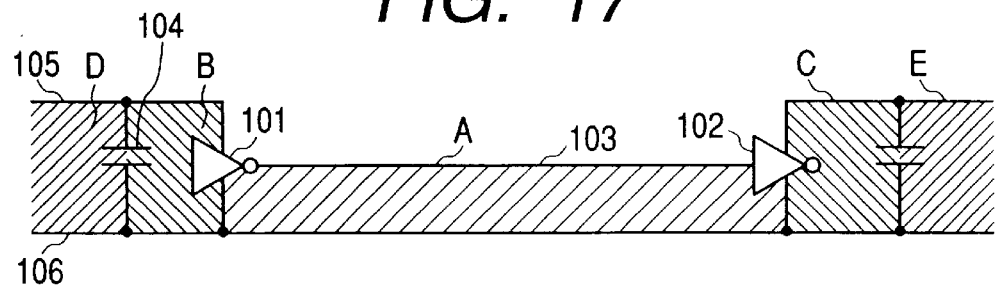
FIG. 17 is a cross-sectional view of a printed wiring board, which shows schematically the relations between the pattern arrangement of signal line, power supply-source line, ground line, and others, and the loop areas on the conventional printed wiring board represented in FIG. 15 and FIG. 16.

As described above, many lands are radially divided into four blocks as shown in FIG. 10 in order to draw signal lines in the same direction per block. However, the present invention is not necessarily limited to the division of four blocks. It is possible to consider dividing many lands into blocks as shown in FIG. 14.

In other words, when dividing many lands into four blocks, those can be drawn exactly in the same direction per block are blocks a, b, c, and d. The lands on spaces ab, bc, cd, and da that exist between those blocks a, b, c, and d are arranged to belong to either one of the adjacent blocks a, b, c, and d. For example, it may be possible to arrange the block structure so that the lands on the spaces ab and da are incorporated into the block a, and then, the lands on the spaces bc and cd are incorporated into the block c, or the lands on the space ab is incorporated into the block a, the lands on the space bc into the block b, the lands on the space cd into the block c, and the lands on the space da into the block d, or the lands on the spaces ab and da are incorporated into the block a, the lands on the space bc into the block b, and the lands on the space cd into the block d, or the lands on the spaces ab and da are incorporated into the space a, the land on the space bc into the block b, and the lands on the space cd into the block c.

Also, in accordance with each of the embodiments described above, the first layer and the second layer are connected by way of through holes. However, the connections are not necessarily limited thereto. It may be possible to connect the first and second layers through the signal connection holes that connect them electrically. For example, via holes may be used for such connection.

Also, in accordance with each of the embodiments described above, the signal line patterns from the lands on the innermost line of many lands in matrix are arranged by way of the through hole and signal lines, and the second through hole. However, the present invention is not limited thereto. It may be possible to arrange the signal line patterns positioned inside many lands on the outermost line by way of the first through hole and signal lines, and the second through hole.

In accordance with each of the embodiments described above, each of many lands in matrix on the printed wiring board where the grid array package, which is a multi-terminal device, is formed to be substantially circular. The present invention is not necessarily limited thereto. For example, it may be possible to form each of the lands in an ellipse other than an exact circle in order to facilitate drawing lines from the lands. Also, it may be possible to arrange the elliptical shapes of lands with the ratio of its flatness that may become higher gradually toward the outer circumference of the basic board.

As described above in detail, the printed wiring board of the present invention, which is provided at least with the first and second layers, and on which is assembled multi-terminal device having a plurality of terminals arranged in matrix thereon, comprises many numbers of lands divided into plural blocks, which are arranged in matrix on the first layer so that each terminal of the multi-terminal devices is connected correspondingly; signal line patterns connected with many lands and drawn out in the same direction per block; the first signal connection holes connected with the lands positioned inside the outermost line of the many lands, which connect the first layer and the second layer electrically; the second signal connection holes positioned outside the lands on the outermost line of the many lands, which connect the first layer and the second layer electrically; and the signal lines having one end thereof connected with the first signal connection holes, and the other end thereof connected with the second signal connection holes. Then, the signal line patterns form the lands positioned on the innermost line of the many lands are arranged through the first signal connection holes, the signal lines, and the second signal connection holes. Thus, the wiring patterns of signal lines can be drawn out regularly from many lands formed in matrix on the assembling surface of the grid array type package to make it possible to provide a printed wiring board capable of easily connecting lines without increasing the layers of printed wiring board or arranging any complicated wiring.

Also, with the arrangement of the ground patterns that surround signal lines, it becomes possible to secure the ground passage of return current, hence making the current loops smaller to reduce unwanted radiant. Also, it becomes possible to make the chipping portions smaller for the grounds in the vicinity of the multi-terminal devices. Thus, the influence of ground bounces and reflections is made smaller accordingly.

What is claimed is:

1. A printed wiring board provided at least with a first layer and a second layer, having multi-terminal device with a plurality of terminals arranged in matrix assembled thereon, comprising:

many numbers of lands divided into blocks, being arranged in matrix on said first layer to connect each terminal of said multi-terminal device correspondingly;

first through holes connected with the lands positioned on the innermost line of said many lands to penetrate between said first layer and said second layer;

second through holes positioned outside the lands on the outermost line of said many lands to penetrate between said first layer and said second layer;

signal lines having one end thereof connected with said first through holes, and the other end thereof connected with said second through holes; and signal line patterns drawn out from the many lands divided into blocks in the same direction, said signal line patterns form the lands positioned on the innermost line of said many lands being arranged through said first though holes, signal lines, and said second through holes.

2. A printed wiring board provided at least with a first layer and a second layer, having multi-terminal device with a plurality of terminals arranged in plane configuration assembled thereon, comprising:

a plurality of lands provided for said first layer, and each terminal of said multi-terminal device is connected respectively;

first signal lines arranged in the area on said first layer positioned outside the lands on the outermost line of said plurality of lands;

first penetrating connection means connected with the lands positioned inside the outermost line of said plurality of lands for penetrating said first layer and said second layer;

second penetrating connection means connected with said first signal lines for penetrating said first layer and said second layer;

second signal lines provided for said second layer to connect one end thereof with said fist penetrating connection means, and the other end thereof with said second penetrating connection means; and first ground patterns provided for said second layer to in the form of surrounding said second signal lines.

3. A printed wiring board according to claim 1, wherein said first ground patterns cover the areas on said second layer corresponding to the areas on said first layer positioned inside the lands on the innermost line of said plurality of lands, and the areas on said second layer corresponding to the areas on said first layer positioned outside the lands on the outermost line of said plurality of lands.

4. A printed wiring board according to claim 2, further comprising:

second ground patterns arranged along said first signal lines on the areas on said first layer positioned outside the lands on the outermost lines of said plurality of lands; and third penetrating connection means for connecting said second ground patterns with said first ground patterns.

5. A printed wiring board according to claim 2, further comprising:

second ground patterns arranged along said first signal lines on the areas on said first layer positioned outside the lands on the outermost line of said plurality of lands;

third ground patterns covering the areas on said first layer positioned inside the lands on the innermost line of said plurality of lands; and connection means provided for said first layer for connecting said third ground patterns and said second ground patterns.

6. A printed wiring board according to claim 4, further comprising:

third ground patterns covering the areas on said first layer positioned inside the lands on the innermost line of said plurality of lands; and connection means provided for said first layer for connecting said third ground patterns and said second ground patterns.

7. A printed wiring board according to claim 2, further comprising:

first power supply-source patterns provided for said second layer, being branched from the nucleus power supply-source pattern;

second power supply-source patterns arranged on said first layer positioned inside the lands on the innermost line of said plurality of lands; and fourth penetrating connection means for connecting said first power-supply source patterns and said second power supply-source patterns.

8. A printed wiring board according to claim 7, further comprising:

bypass capacitors arranged between said first power supply-source patterns and ground patterns.

9. A printed wiring board according to claim 2, wherein said printed wiring board is installed on an electronic equipment.

10. A printed wiring board comprising:

a first printed wiring layer formed on one side of said printed wiring board;

a second printed wiring layer formed on another side of said printed wiring board;

a plurality of groups of lands divided into a plurality of blocks, provided on said first printed wiring layer, each of said plurality of groups of lands in said blocks being arranged in a plurality of matrices, and each land of said plurality of groups of lands being wired with a signal line;

a second plurality of groups of lands, divided into a plurality of second blocks, provided on said second printed wiring layer correspondingly to said lands provided on said first printed wiring layer, each of said second plurality of groups of lands in said second blocks being arranged in a plurality of matrices; and first through holes and second through holes provided on each said printed wiring layer, and at least one signal line connecting one of said first through holes with a respective one of said second through holes.

11. A printed wiring board according to claim 10, wherein said blocks in said first and second printed wiring layers are divided for each side of said printed wiring board and said signal line being wired so that said signal line is led out in a peripheral direction of said printed wiring board.

* * * * *

UNITED STATES PATENT AND TRADEMARK OFFICE
CERTIFICATE OF CORRECTION

PATENT NO. : 6,489,574 B1
DATED : December 3, 2002
INVENTOR(S) : Toru Otaki et al.

It is certified that error appears in the above-identified patent and that said Letters Patent is hereby corrected as shown below:

<u>Title page,</u>
Item [57], ABSTRACT,
Line 18, "Radiant," should read -- radiant noise, --.

<u>Column 1,</u>
Line 9, "a" should be deleted.

<u>Column 5,</u>
Line 6, "is" should read -- are --.

<u>Column 7,</u>
Line 52, "becomes smaller" should read -- do --;
Line 54, "board 200," should read -- board 200 become smaller, --.

<u>Column 8,</u>
Line 65, "them" should read -- those --.

<u>Column 9,</u>
Line 23, "ends" should read -- end --;
Line 24, "are" should read -- is --.

<u>Column 10,</u>
Line 20, "its" should read -- their --.

<u>Column 11,</u>
Line 35, "fist" should read -- first --;
Line 39, "to" should be deleted.

Signed and Sealed this

Eighteenth Day of November, 2003

JAMES E. ROGAN
*Director of the United States Patent and Trademark Office*